(12) United States Patent
Thombare et al.

(10) Patent No.: US 9,478,438 B2
(45) Date of Patent: Oct. 25, 2016

(54) METHOD AND APPARATUS TO DEPOSIT PURE TITANIUM THIN FILM AT LOW TEMPERATURE USING TITANIUM TETRAIODIDE PRECURSOR

(71) Applicant: Lam Research Corporation, Fremont, CA (US)

(72) Inventors: Shruti Vivek Thombare, Sunnyvale, CA (US); Ishtak Karim, San Jose, CA (US); Sanjay Gopinath, Fremont, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/464,462

(22) Filed: Aug. 20, 2014

(65) Prior Publication Data
US 2016/0056053 A1    Feb. 25, 2016

(51) Int. Cl.
| | | |
|---|---|---|
| H01L 21/44 | (2006.01) | |
| H01L 21/3205 | (2006.01) | |
| C23C 16/505 | (2006.01) | |
| H01L 21/321 | (2006.01) | |
| C23C 16/14 | (2006.01) | |
| C23C 16/448 | (2006.01) | |
| C23C 16/455 | (2006.01) | |
| C23C 16/34 | (2006.01) | |

(52) U.S. Cl.
CPC ......... *H01L 21/32053* (2013.01); *C23C 16/14* (2013.01); *C23C 16/4485* (2013.01); *C23C 16/45542* (2013.01); *C23C 16/45553* (2013.01); *C23C 16/505* (2013.01); *H01L 21/321* (2013.01); *H01L 21/32051* (2013.01); *C23C 16/34* (2013.01)

(58) Field of Classification Search
CPC ...................... H01L 21/3141; H01L 21/0228
See application file for complete search history.

(56) References Cited

U.S. PATENT DOCUMENTS

| | | | |
|---|---|---|---|
| 4,492,620 A | 1/1985 | Matsuo et al. | |
| 4,500,563 A | 2/1985 | Ellenberger et al. | |
| 4,609,903 A | 9/1986 | Toyokura et al. | |
| 5,139,825 A | 8/1992 | Gordon et al. | |
| 5,194,398 A | 3/1993 | Miyachi et al. | |

(Continued)

FOREIGN PATENT DOCUMENTS

| | | |
|---|---|---|
| EP | 0 277 766 | 8/1988 |
| EP | 0 541 212 | 5/1993 |

(Continued)

OTHER PUBLICATIONS

U.S. Appl. No. 14/464,475, filed Aug. 20, 2014, entitled "Method to Tune TIOX Stoichiometry Using Atomic Layer Deposited TI Film to Minimize Contact Resistance for TIOX/TI Based MIS Contact Scheme for CMOS."

(Continued)

*Primary Examiner* — Angel Roman
(74) *Attorney, Agent, or Firm* — Weaver Austin Villeneuve & Sampson LLP

(57) ABSTRACT

Methods of depositing highly conformal and pure titanium films at low temperatures are provided. Methods involve exposing a substrate to titanium tetraiodide, purging the chamber, exposing the substrate to a plasma, purging the chamber, and repeating these operations. Titanium films are deposited at low temperatures less than about 450° C.

25 Claims, 6 Drawing Sheets

(56) References Cited

U.S. PATENT DOCUMENTS

| | | |
|---|---|---|
| 5,223,443 A | 6/1993 | Chinn et al. |
| 5,496,608 A | 3/1996 | Matsuda et al. |
| 5,593,914 A | 1/1997 | Evans, Jr. et al. |
| 5,670,432 A | 9/1997 | Tsai |
| 5,700,519 A | 12/1997 | Lam |
| 5,856,003 A | 1/1999 | Chiu |
| 5,874,368 A | 2/1999 | Laxman et al. |
| 5,932,286 A | 8/1999 | Beinglass et al. |
| 5,961,791 A | 10/1999 | Frisa et al. |
| 5,962,923 A | 10/1999 | Xu et al. |
| 6,045,666 A | 4/2000 | Satitpunwaycha et al. |
| 6,054,382 A | 4/2000 | Hsu et al. |
| 6,090,709 A | 7/2000 | Kaloyeros et al. |
| 6,093,966 A | 7/2000 | Venkatraman et al. |
| 6,140,223 A | 10/2000 | Kim et al. |
| 6,191,033 B1 | 2/2001 | Liao et al. |
| 6,217,721 B1 | 4/2001 | Xu et al. |
| 6,235,163 B1 | 5/2001 | Angelo et al. |
| 6,270,572 B1 | 8/2001 | Kim et al. |
| 6,271,591 B1 | 8/2001 | Dubin et al. |
| 6,333,547 B1 | 12/2001 | Tanaka et al. |
| 6,337,151 B1 | 1/2002 | Uzoh et al. |
| 6,342,448 B1 | 1/2002 | Lin et al. |
| 6,346,741 B1 | 2/2002 | Van Buskirk et al. |
| 6,350,688 B1 | 2/2002 | Liu et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,541,374 B1 | 4/2003 | de Felipe et al. |
| 6,551,893 B1 | 4/2003 | Zheng et al. |
| 6,566,246 B1 | 5/2003 | de Felipe et al. |
| 6,569,783 B2 | 5/2003 | Uzoh et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,841,044 B1 | 1/2005 | Ruzic |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,967,154 B2 * | 11/2005 | Meng et al. ............... 438/622 |
| 6,987,240 B2 | 1/2006 | Jennings et al. |
| 6,995,471 B2 | 2/2006 | Shue et al. |
| 7,001,844 B2 | 2/2006 | Chakravarti et al. |
| 7,041,335 B2 | 5/2006 | Chung |
| 7,041,595 B2 | 5/2006 | Chopra |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,473,638 B2 | 1/2009 | Yang et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,670,646 B2 * | 3/2010 | Ahn et al. ............... 427/255.32 |
| 7,682,657 B2 | 3/2010 | Sherman |
| 7,687,409 B2 | 3/2010 | Ahn et al. |
| 7,713,592 B2 | 5/2010 | Nguyen et al. |
| 7,727,882 B1 | 6/2010 | Wu et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,456,007 B2 | 6/2013 | Sandhu et al. |

(56) References Cited

U.S. PATENT DOCUMENTS

| | | |
|---|---|---|
| 8,524,612 B2 | 9/2013 | Li et al. |
| 8,592,328 B2 | 11/2013 | Hausmann et al. |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,214,334 B2 | 12/2015 | Swaminathan et al. |
| 9,230,800 B2 | 1/2016 | LaVoie et al. |
| 9,257,274 B2 | 2/2016 | Kang et al. |
| 9,287,113 B2 | 3/2016 | Kang et al. |
| 2001/0039113 A1 | 11/2001 | Blalock et al. |
| 2001/0054769 A1 | 12/2001 | Raajimakers et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0212041 A1 | 10/2004 | Takamatsu et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho |
| 2005/0085070 A1 | 4/2005 | Park |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0186793 A1 | 8/2005 | Omoto et al. |
| 2005/0196977 A1 | 9/2005 | Saito et al. |
| 2005/0233553 A1 | 10/2005 | Kountz et al. |
| 2005/0255700 A1 | 11/2005 | Gopalraja et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0018214 A1 | 1/2007 | Ahn et al. |
| 2007/0020922 A1 | 1/2007 | Chiang et al. |
| 2007/0065576 A1 | 3/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0193982 A1 | 8/2007 | Brown et al. |
| 2007/0200243 A1 | 8/2007 | Kraus et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0087890 A1* | 4/2008 | Ahn et al. ....................... 257/43 |
| 2008/0123394 A1 | 5/2008 | Lee et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274299 A1* | 11/2008 | Chen et al. .................... 427/569 |
| 2008/0274302 A1 | 11/2008 | Hasebe et al. |
| 2008/0299765 A1* | 12/2008 | Besling ......................... 438/653 |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0183994 A1 | 7/2009 | Misra et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0086516 A1 | 4/2011 | Lee et al. |
| 2011/0120943 A1* | 5/2011 | Johansson et al. ........... 210/506 |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0202356 A1 | 8/2012 | Huang et al. |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |

(56) References Cited

U.S. PATENT DOCUMENTS

| | | | |
|---|---|---|---|
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0247238 A1 | 9/2015 | Pasquale et al. |
| 2015/0249013 A1 | 9/2015 | Arghavani et al. |
| 2016/0056037 A1 | 2/2016 | Thombare et al. |
| 2016/0064211 A1 | 3/2016 | Swaminathan et al. |

FOREIGN PATENT DOCUMENTS

| | | |
|---|---|---|
| EP | 0 720 213 A2 | 7/1996 |
| EP | 1 703 552 A2 | 9/2006 |
| EP | 2 278 046 | 1/2011 |
| JP | 4364320 | 8/2009 |
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2006/026350 | 3/2006 |
| WO | WO 2006/104741 | 10/2006 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 14/335,785, filed Jul. 18, 2014, entitled "Methods for Depositing Silicon Oxide."
U.S. Appl. No. 14/552,011, filed Nov. 24, 2014, entitled "Selective Inhibition in Atomic Layer Deposition of Silicon-Containing Films."
U.S. Appl. No. 14/678,736, filed Apr. 3, 2015, entitled "Deposition of Conformal Films by Atomic Layer Deposition and Atomic Layer Etch."
U.S. Appl. No. 12/154,984, filed May 28, 2008, entitled "Methods and Apparatus for Depositing Titanium Based Diffusion Barrier Films."
US Notice of Allowance, dated Jul. 31, 2002, issued in U.S. Appl. No. 09/862,539.
US Office Action, dated Jun. 15, 2004, issued in U.S. Appl. No. 10/289,237.
US Notice of Allowance, dated Sep. 3, 2004, issued in U.S. Appl. No. 10/289,237.
US Office Action, dated Sep. 2, 2009, issued in U.S. Appl. No. 12/002,780.
US Notice of Allowance, dated Jan. 27, 2010, issued in U.S. Appl. No. 12/002,780.
US Office Action, dated Oct. 6, 2009, issued in U.S. Appl. No. 12/154,984.
US Final Office Action, dated Apr. 15, 2010, issued in U.S. Appl. No. 12/154,984.
US Office Action dated Mar. 15, 2013 issued in U.S. Appl. No. 13/084,399.
US Final Office Action dated Sep. 13, 2013 issued in U.S. Appl. No. 13/084,399.
US Notice of Allowance dated Jan. 15, 2014 issued in U.S. Appl. No. 13/084,399.
US Office Action dated Jan. 2, 2015 issued in U.S. Appl. No. 14/231,554.
US Final Office Action dated Jun. 10, 2015 issued in U.S. Appl. No. 14/231,554.
US Notice of Allowance dated Aug. 31, 2015 issued in U.S. Appl. No. 14/231,554.
US Office Action dated Sep. 14, 2012 issued in U.S. Appl. No. 13/084,305.
US Final Office Action dated Apr. 25, 2013 issued in U.S. Appl. No. 13/084,305.
US Office Action dated Apr. 13, 2011 issued in U.S. Appl. No. 12/889,132.
US Notice of Allowance dated Sep. 30, 2011 issued in U.S. Appl. No. 12/889,132.
US Office Action dated Aug. 1, 2012 issued in U.S. Appl. No. 13/011,569.
US Final Office Action dated Feb. 26, 2013 issued in U.S. Appl. No. 13/011,569.
US Notice of Allowance dated May 6, 2013 issued in U.S. Appl. No. 13/011,569.
US Office Action dated Apr. 4, 2013 issued U.S. Appl. No. 13/242,084.
US Notice of Allowance dated Jun. 19, 2013 issued U.S. Appl. No. 13/242,084.
US Notice of Allowance dated Sep. 19, 2013 issued U.S. Appl. No. 13/242,084.
US Office Action dated Sep. 21, 2015 issued U.S. Appl. No. 14/607,997.
US Notice of Allowance dated Aug. 7, 2014 issued U.S. Appl. No. 14/133,239.
US Notice of Allowance dated Nov. 26, 2014 issued U.S. Appl. No. 14/133,239.
US Office Action dated Apr. 29, 2013 issued U.S. Appl. No. 13/224,240.
US Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Office Action dated Jun. 7, 2013 issued U.S. Appl. No. 13/414,619.
US Notice of Allowance dated Jul. 26, 2013, issued U.S. Appl. No. 13/414,619.
US Office Action dated May 24, 2013 issued U.S. Appl. No. 13/472,282.
US Notice of Allowance dated Oct. 4, 2013 issued U.S. Appl. No. 13/472,282.
US Office Action dated May 21, 2014 issued in U.S. Appl. No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated May 15, 2015 issued in U.S. Appl. No. 14/074,617.
US Office Action dated Aug. 14, 2015 issued in U.S. Appl. No. 14/061,587.
US Office Action dated Mar. 2, 2015 issued in U.S. Appl. No. 14/137,860.
US Notice of Allowance dated Oct. 1, 2015 issued in U.S. Appl. No. 14/137,860.

(56) References Cited

OTHER PUBLICATIONS

US Notice of Allowance [Supplemental Notice of Allowability] dated Oct. 22, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.
US Office Action dated Oct. 21, 2015 issued in U.S. Appl. No. 14/194,549.
US Notice of Allowance dated Aug. 5, 2015 issued in U.S. Appl. No. 14/183,287.
US Office Action dated Jul. 2, 2015 issued in U.S. Appl. No. 14/187,145.
US *Ex Parte Quayle* Action dated Oct. 8, 2015 issued in U.S. Appl. No. 14/194,324.
US Office Action dated Apr. 13, 2015 issued in U.S. Appl. No. 14/335,785.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in CN 201180045808.6.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Trial Decision (English description) dated May 25, 2015 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Abe et al. (2000) "Effect of Ti insertion between Cu and TiN Layers on electromigration reliability in Cu/(Ti)/TiN/Ti layered damascene interconnects", *IEEE* 00CH37059. 38$^{th}$ Annual International Reliability Physics Symposium, San Jose, California, pp. 333-338.
Cecchi et al., (2007) "Ultra-thin conformal pore-sealing of low-k materials by plasma-assisted ALD," *University of New Mexico*, Albuquerque, NM, *Sandia National Labs*, Albuquerque, NM, 1 page.

Chen et al. (Jan./Feb. 1999) "Low Temperature Plasma-Assisted Chemical Vapor Deposition of Tantalum Nitride form Tantalum Pentabromide for Copper Metallization," *J. Vac. Sci. Technol.*, B 17(1):182-185.
Cheng et al. (Mar./Apr. 1995) "Directional Deposition of Cu into Semiconductor Trench Structures Using Ionized Magnetron Sputtering," *J. Vac. Sci. Technol.*, B 13(2):203-208.
Cho et al. (Dec. 1998) "Remote Plasma-Assisted Metal Organic Chemical Vapor Deposition of Tantalum Nitride Thin Films with Different Radicals," *Japanese Journal of Appl. Phys.*, 37(Part 1)(12A):6502-6505.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
D'Couto et al. (2001) "In situ physical vapor deposition of ionized Ti and TiN thin films using hollow cathode magnetron plasma source," *J.Vac.Sci.Technol. B.* 19(1):244-249.
Elam, J.W. (2003) Surface chemistry and film growth TiN atomic layer deposition using TDMAT and $NH^3$, *Elsevier Science B.V.*, 436:145-156.
Endle et al. (May/Jun. 1998) "X-Ray Photoelectron Spectroscopy Study on TiN Films Produced with Tetrakis (dimethylamido)Titanium and Selected N-Containing Precusors on $SiO.sub.2$," *J. Vac. Sci. Technol.*, A 16(3):1262-1267.
Green et al. (Dec. 1997) "Determination of Flux Ionization Fraction Using a Quartz Crystal Microbalance and a Gridded Energy Analyzer in an Ionized Magnetron Sputtering System," *Rev. Sci. Instrum.*, 68(12):4555-4560.
Han et al. (May 1998) "Barrier Metal Properties of Amorphous Tantalum Nitride Thin Films Between Platnium and Silicon Deposited Using Remote Plasma Metal Organic Chemical Vapor Method," *Jpn. J. Appl. Phys.*, 37 Part 1(5A):2646-2651.
Hausmann et al. (2002) "Atomic Layer Deposition of Hafnium and Zirconium Oxides Using Metal Amide Precursors," *Chem. Mater.* 14(10):4350-4358.
Hayden et al. (1999) "Helion Plasma Source for Ionized Physical Vapor Deposition," 1999, *Surface and Coatings Technology*, pp. 120-121, pp. 401-404.
Hayden et al. (Mar./Apr. 1998) "Characterization of Magnetron-Sputtered Partially Ionized Aluminum Deposition," *J. Vac. Sci. Technol.*, A 16(2):624-627.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Klawuhn et al. (Jul./Aug. 2000) "Ionized Physical-vapor deposition Using a Hollow-Cathode Magnetron Source for Advanced Metallization," *J. Vac, Sci, Technol*. A, 18(4):1546-1549.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," Journal of Non-Crystalline Solids, 338-340:797-801.
Lee et al. (1996) "The Failure Mechanism of MOCVD TiN Diffusion Barrier at High Temperature," *Mat. Res. Soc. Symp. Proc.*, 324:279-284.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju (2005) "Low-impurity, highly conformal atomic layer deposition of titanium nitride using $NH_3$—Ar—$H_2$ plasma treatment for capacitor electrodes," *Materials Letters*, 59:615-617.

(56) References Cited

OTHER PUBLICATIONS

Li, Xingcun et al., (2011) "Atomic Layer Deposition $Al_2O_3$ Thin Films in Magnetized Radio Frequency Plasma Source," *Physics Procedia* 18:100-106.

Lucovsky, Gerald et al. (1990) "Formation of Thin Films by Remote Plasma Enhanced Chemical Vapor Deposition (Remote PECVD)," in *Handbook of Plasma Processing Technology*, eds. Rossnagel, Cuomo and Westwood, Noyes Publications, pp. 387-408.

Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.

Musher et al. (Feb. 1996) "Atmospheric Pressure Chemical Vapor Deposition of Titanium Nitride from Tetrakis (diethylamido) Titanium and Ammonia," *J. Electochem. Soc.*, 143(2):736-744.

Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.

Peng et al. (Jul./Aug. 1998) "Structural and Electrical Properties of Chemical Vapor Deposition Tungsten Overgrowth on Physical Vapor Deposited and Metalorganic Chemical Vapor Deposited TiNAdhesion Layers," *J. Vac. Sci. Technol., B* 16(4):2013-2018.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

Puurunen, Riikka L. (2005) "Surface chemistry of atomic layer deposition: A case study for the trimethylaluminum/water process," *Journal of Applied Physics*, 97:121301-1-121301-52.

Reif et al. (Feb. 1990) "Plasma Enhanced Chemical Vapor Deposition of Thin Films for Microelectronics," *Handbook of Plasma Processing Technology*, eds: Rossnagel, Cuomo and Westwood, Noyes Publications, pp. 260-284.

Schumacher Products, TDEAT (Tetrakis-diethylamino Titanium), Electronic Grade, www.schumacher.com/tdeat.html, printed Jun. 5, 2001, 1 page.

Truong et al. (1995) "Low-Pressure Deposition of TiN Thin Films from a Tetrakis (diethylamido) Titanium Precursor," *J. Phys. Chem*, 99:8831-8842.

Tsai et al. (May 1996) "Comparison of the Diffusion Barrier Properties of Chemical-Vapor-Deposited TaN and Sputtered TaN Between Cu and Si," *J. Appl. Phys.*, 79(9):6932-6938.

Ueki et al. (2004) "Effects of Ti Addition on Via Reliability in Cu Dual Damascene Interconnects," *IEEE Translations on Electron Devices*, 51(11):1883-1891.

van der Straten et al. (2004) "Atomic layer deposition of tantalum nitride for ultrathin liner applications in advanced copper metallization schemes," *Journal of Materials Research*, 19(2):447-453.

Wu et al. (2008) "Ti-based Barrier for Cu Interconnect Applications", *International Interconnect Technology Conference paper* on Jun. 1, 3 pp.

Zhong et al. (Mar./Apr. 1999) "Ionized Titanium Deposition into High tAspect Ratio Vias and Trenches", American Vacuum Society, *J. Vac. Sci. Technol. B* 17(2):405-409.

US Notice of Allowance dated Mar. 9, 2016 issued in U.S. Appl. No. 14/194,324.

US Office Action dated Mar. 2, 2016 issued in U.S. Appl. No. 14/464,475.

Chaukulkar et al., (May/Jun. 2013) "Atomic layer deposition of titanium dioxide using titanium tetrachloride and titanium tetraisopropoxide as precursors," *J. Vac. Sci. Technol. A*, 31(3):031509-1 to 031509-5.

Kukli et al., (2000) "Atomic Layer Deposition of Titanium Oxide from $TiI_4$ and $H_2O_2$," *Chemical Vapor Deposition*, 6(6):303-310.

Kukli et al., (2000) "Real-Time Monitoring in Atomic Layer Deposition of $TiO_2$ from $TiI_4$ and $H_2O-H_2O_2$," *Langmuir*, 16(21):8122-8128.

Schuisky et al., (2000) "Atomic Layer Chemical Vapor Deposition of $TiO_2$ Low Temperature Epitaxy of Rutile and Anatase," *Journal of the Electrochemical Society*, 147(9):3319-3325.

\* cited by examiner

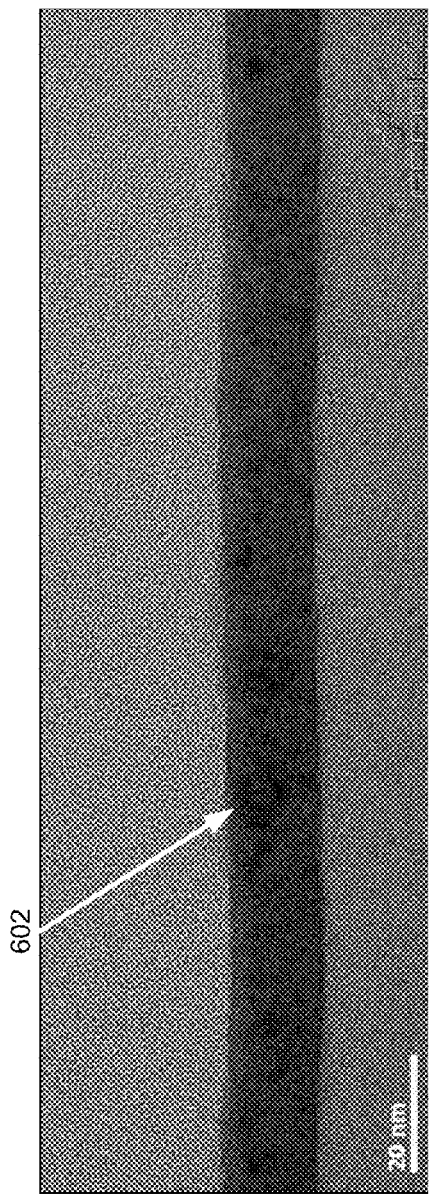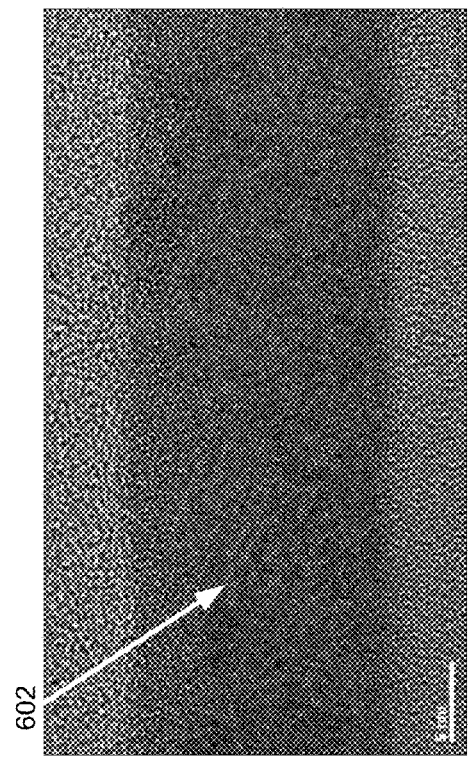

METHOD AND APPARATUS TO DEPOSIT PURE TITANIUM THIN FILM AT LOW TEMPERATURE USING TITANIUM TETRAIODIDE PRECURSOR

BACKGROUND

Semiconductor manufacturing processes often involve deposition of titanium or titanium-containing compounds. Conventionally, titanium thin films have been deposited by physical vapor deposition sputtering methods. As semiconductor devices scale to smaller and smaller technology nodes, shrinking feature dimensions makes deposition of highly conformal and pure titanium films more challenging. Increasing aspect ratios can lead to incomplete step coverage on feature surfaces, resulting in poor barrier performance in semiconductor devices. Other methods employed for depositing titanium thin films have resulted in titanium films with impurities due to the precursors used, or have resulted in thermal budget issues.

SUMMARY

Provided herein are methods of depositing titanium or titanium-containing compounds. One aspect includes depositing titanium on a semiconductor substrate in a chamber by depositing titanium using atomic layer deposition cycles at a temperature less than about 450° C., where each cycle includes (i) exposing the substrate to titanium tetraiodide, (ii) purging the chamber, (iii) exposing the substrate to an ignited plasma, and (iv) purging the chamber, and repeating (i) through (iv) until the desired thickness of titanium is deposited on the substrate. Each cycle may deposit titanium having a thickness of about 0.5 Å.

In various embodiments, the method further includes pre-cleaning the substrate prior to exposing the substrate to titanium tetraiodide. In some embodiments, the substrate is exposed to a carrier gas throughout (i) through (v). The carrier gas may be selected from the group consisting of argon, hydrogen, and combinations thereof. The plasma may be generated remotely or in the chamber.

In various embodiments, the method further includes annealing the deposited titanium to form titanium silicide. In some embodiments, the substrate is exposed to titanium tetraiodide in (i) for a duration between 1 and about 30 seconds, the substrate is purged in (ii) and (iv) each for a duration between 1 and 5 seconds, and the substrate is exposed to a plasma in (ii) for a duration between 1 and 10 seconds.

In some embodiments, the deposited titanium has less than about 1% contamination, or less than about 0.1% contamination. In some embodiments, the deposited titanium has a film density of at least about 4.0 g/cc. The deposited titanium may have a step coverage of between about 70% and about 100%. In some embodiments, the chamber pressure may be between about 0.1 Torr and about 20 Torr. In some embodiments, the features on the substrate may have aspect ratios between about 3:1 and about 10:1.

In various embodiments, the method further includes depositing titanium nitride using atomic layer deposition cycles at a temperature less than about 450° C., where each cycle includes (i) exposing the substrate to titanium tetraiodide, (ii) purging the chamber, (iii) exposing the substrate to a nitrogen-containing gas and igniting a plasma, and (iv) purging the chamber; and repeating (i) through (iv) until the desired thickness of titanium is deposited on the substrate. In some embodiments, the gas is selected from the group consisting of nitrogen, ammonia, hydrazines, and amines.

Another aspect involves an apparatus for depositing titanium on a semiconductor substrate, where the apparatus includes a reaction chamber including a pedestal for holding the substrate; at least one outlet for coupling to a vacuum; one or more process gas inlets coupled to one or more precursor sources; a radio frequency (RF) generator; and a controller for controlling operations in the apparatus. The controller includes machine-readable instructions for: (a) setting the temperature of the pedestal in the reaction chamber to a temperature less than about 450° C., (b) introducing titanium tetraiodide to the chamber, (c) purging the chamber, (d) providing a plasma in the chamber, and (e) purging the chamber, and (f) repeating (b) through (e).

In some embodiments, the instructions are configured to deposit about 0.5 Å of titanium in each cycle of (b) through (e). In various embodiments, the controller further includes machine-readable instructions for: (g) introducing titanium tetraiodide to the chamber, (h) purging the chamber, (i) providing a plasma in the chamber, (j) introducing a nitrogen-containing gas to the chamber, and (k) purging the chamber; and (l) repeating (g) through (k). In some embodiments, the gas is selected from the group consisting of nitrogen, ammonia, hydrazines, and amines.

These and other aspects are described further below with reference to the drawings.

BRIEF DESCRIPTION OF THE DRAWINGS

FIGS. 6A and 6B are transmission electron microscopy (TEM) images of deposited films in accordance with experiments of the disclosed embodiments.

DETAILED DESCRIPTION

Figure 1:
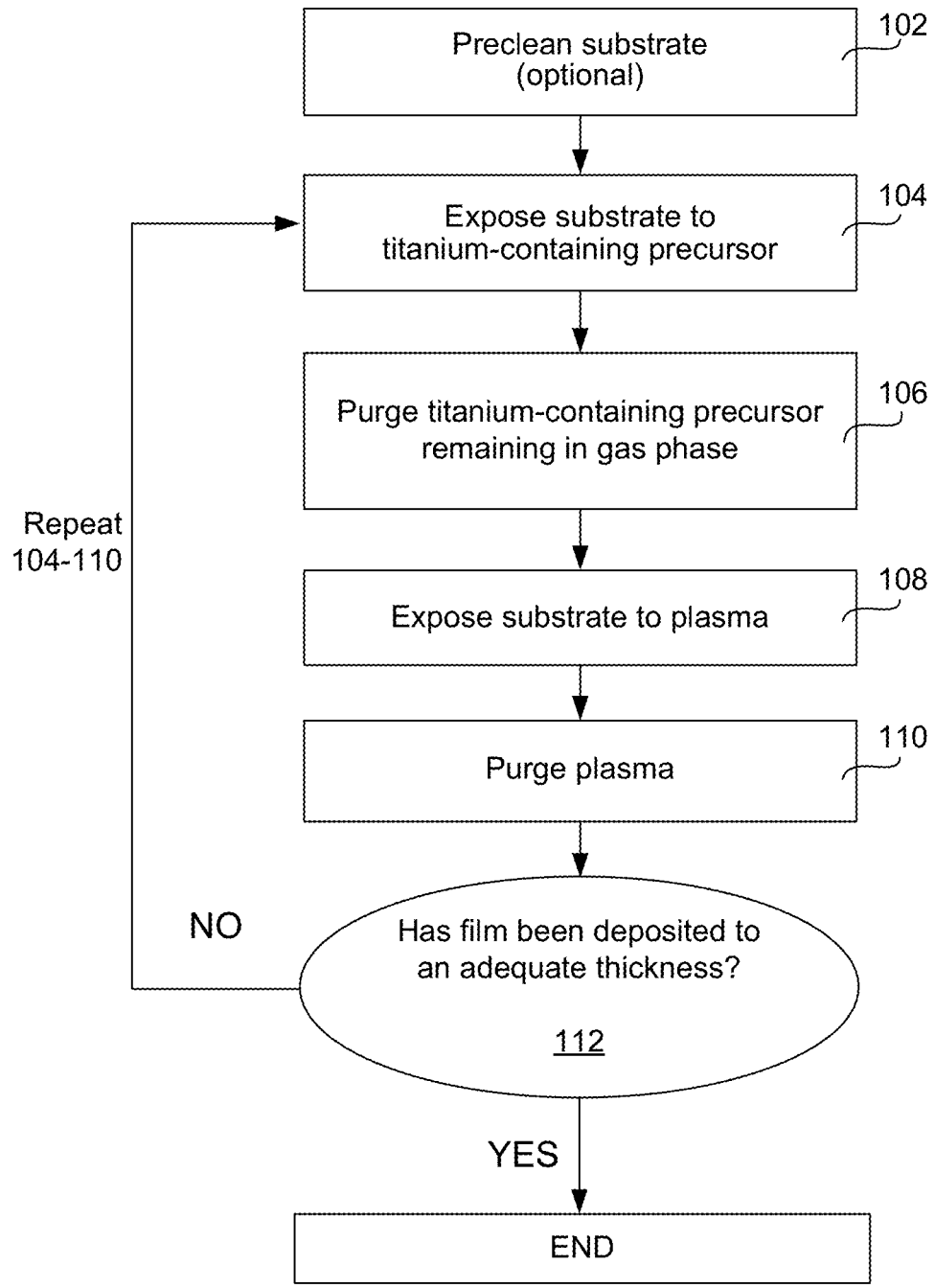
FIG. 1 is a process flow diagram illustrating operations in a method of depositing titanium according to various embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Deposition of pure, thin, conformal titanium films is critical to semiconductor device fabrication. Titanium films and titanium compounds are used as barrier layers in both front end of line (FEOL) and back end of line (BEOL) metallization. In particular, titanium films are used as barriers in contacts, such as tungsten or copper contacts. Conventionally, barrier layers used in contacts have included tantalum and tantalum nitride, or a combination of both. Deposition methods typically included physical vapor deposition sputtering. However, contacts having titanium barrier layers are of particular interest due to titanium's wide applicability to various components of a semiconductor device as a low resistance material.

As the industry moves towards development of smaller and smaller semiconductor devices, features shrink and aspect ratios of features where titanium is to be deposited are high. Such features may have a feature opening of about 30 nm or less. Examples of high aspect ratios include aspect ratios between about 3:1 and 10:1, such as 5:1. Step coverage is low when conventional techniques are used to deposit titanium into high aspect ratio features. Due to the directional nature of the sputtering method, step coverage is only between about 15% and about 20% and uniformity of the deposited thin films is low.

Chemical vapor deposition (CVD) methods have been proposed for depositing titanium into features at high aspect ratios to form highly conformal films. However, deposition by CVD involves use of metal-organic titanium precursors, such as TDMAT, TEMAT, TDEAT, etc., or use of titanium chloride ($TiCl_4$). Using metal-organic precursors often results in impurities in the titanium film due to incorporation of the organic species such that the titanium film includes carbon and nitrogen contamination. Deposition using $TiCl_4$ involves decomposing $TiCl_4$, which is performed at a high temperature (e.g., over about 600° C.) to preclude incorporation of chlorine into the deposited titanium film. Process conditions for depositing titanium using conventional techniques may exceed the thermal budget for the device such that existing underlayers of the substrate may be damaged or rendered useless when the substrate is exposed to high temperatures.

Provided herein is a method for depositing highly conformal and pure titanium films in high aspect ratio features at low temperature for use in semiconductor processing. The methods involve deposition of titanium using titanium-containing precursor (such that the precursor has a generic formula of $Ti_xR_y$). Although other titanium-containing compounds may be used, titanium tetraiodide ($TiI_4$) is used as an example for the disclosed embodiments. The advantages of the disclosed embodiments include deposition using $TiI_4$ at low temperatures, deposition of substantially pure titanium films with little to no impurities, and wide applicability of the deposition methods to depositing both titanium and titanium compounds in both FEOL and BEOL applications.

Titanium tetraiodide is particularly useful as a titanium precursor because although iodine is less volatile than some other halides, the titanium-iodine bond is more easily broken than other bonds, such as titanium-chlorine bonds. This is due to the lower $\Delta G$ (Gibbs free energy) of the titanium-iodine bond ($\Delta G$ for $TiI_4$=−370.69 kJ/mol; $\Delta G$ for $TiCl_4$=−725.3 kJ/mol; $\Delta H$ (enthalpy of formation) for $TiI_4$=−375.72 kJ/mol; $\Delta H$ for $TiCl_4$=−762.32 kJ/mol).

FIG. 1 provides a process flow diagram of operations for performing a method in accordance with disclosed embodiments. The operations of FIG. 1 may be performed at a temperature less than about 450° C. for FEOL applications or less than about 400° C. for BEOL applications. In various embodiments, the temperature of a chamber where the operations of FIG. 1 are performed is less than about 350° C. The pressure of the chamber may be between about 0.1 Torr and about 20 Torr, or between about 1 Torr and about 3 Torr. A carrier gas may flow during the operations in FIG. 1. The carrier gas may be any inert gas such as argon, which may flow at a flow rate between about 100 sccm and about 300 sccm. Gases such as argon are particularly suitable for deposition of highly pure titanium films. In embodiments where a titanium compound is to be deposited on a substrate, a secondary gas may be used in conjunction with the carrier gas or instead of the carrier gas, such as nitrogen ($N_2$), or a nitrogen-containing gas, for deposition of TiN.

In operation 102 of FIG. 1, the substrate may be optionally precleaned. Precleans may include heat treatment, plasma treatment (for example with Ar or reactive F or Cl-based chemistry) for a time up to about 2 minutes, or any other suitable precleaning treatment.

In operation 104, the substrate is exposed to a titanium-containing precursor such a $TiI_4$. The titanium-containing precursor is adsorbed onto active sites on the substrate surface. In some embodiments, the substrate is exposed for a duration sufficient to cover substantially all of the active sites, such as at least about 80%, or at least about 90% of the active sites. In various embodiments, the substrate is exposed to a titanium-containing precursor for a time between about 1 second and about 30 seconds.

The titanium-containing precursor may have high vapor pressure, such as greater than about 110 mTorr at about 85° C. Examples of titanium-containing precursors include compounds having the formula $TiX_n$, where n is an integer between and including 2 through 4, and X is a halide. Specific examples include $TiI_4$, $TiCl_4$, $TiF_4$, and $TiBr_4$. In various embodiments, the substrate is exposed to $TiI_4$. In some embodiments, the titanium-containing precursor is a non-organic compound. The titanium-containing precursor may be stored in a bubbler upstream of the deposition chamber. The bubbler may be set at a temperature between about 80° C. and about 160° C., or less than about 100° C.

Operation 104 may be performed with or without a plasma. If a plasma is used, the plasma may be a remote or in-situ plasma. The plasma may have a frequency of between about 13.56 MHz and about 27 MHz. In some embodiments, the plasma has a frequency of 27 MHz. The power of the plasma may be between about 0.3 $W/cm^2$ and about 0.6 $W/cm^2$.

In operation 106, the chamber is purged of any remaining titanium-containing precursor left in gas phase. As such, the flow of the titanium-containing precursor is stopped, and the carrier gas is continuously flowing into the chamber during this operation. This operation may be performed for a time between about 1 second and about 5 seconds.

In operation 108, the substrate is exposed to a plasma. Any inert gas may be flowed during this operation, such as argon or $H_2$. In some embodiments, a mixture of argon and $H_2$ are flowed while the plasma is ignited. The plasma may be either a remote or in-situ plasma and may have any of the frequencies and powers described above with respect to operation 104. In many embodiments, this plasma dose may be performed for a duration between about 1 second and about 10 seconds. During this operation, bonds between titanium and any ligands, such as an iodine atom, may be broken such that solid and substantially pure (less than about 1% contamination) titanium remains on the substrate.

In operation 110, the plasma is turned off and the chamber is purged such that only the carrier gas, which has been continuously flowing throughout operations 104 and 108, continues to flow into the chamber. This purge may be performed for a duration between about 1 second and about 5 seconds. During this operation, any compounds formed from the ligands removed during operation 108 may be purged. For example, iodine ($I_2$) may be removed during this operation. The plasma may be an in situ plasma or a remote plasma.

In operation 112, it is determined whether the deposited film has been deposited to an adequate thickness, which may be any suitable thickness desired for the deposition of the pure and highly conformal titanium. If not, then operations 104-110 are repeated until the film is deposited to an adequate thickness.

Figure 2:
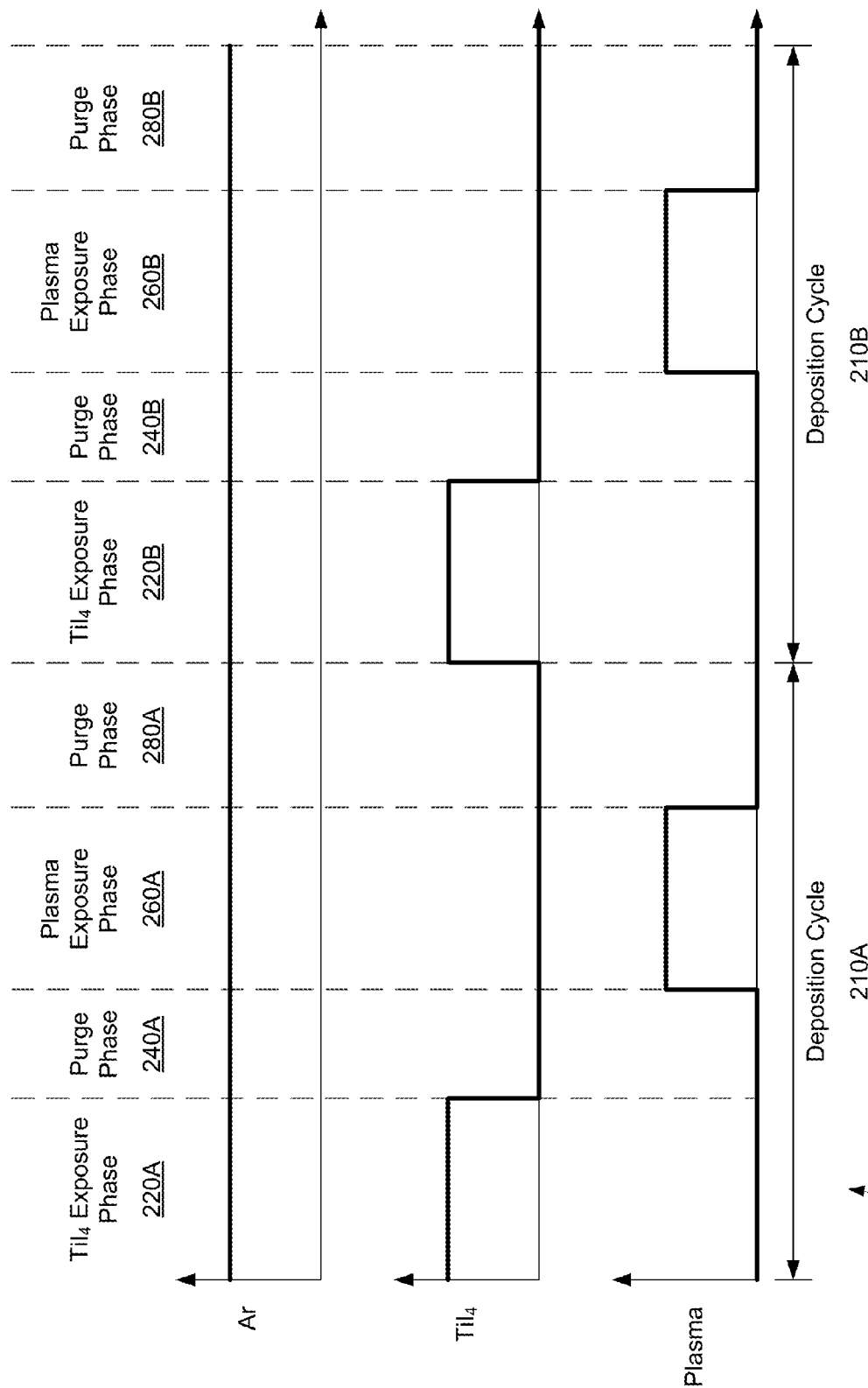
FIG. 2 illustrates timing sequence diagram of pulses according to various embodiments.

FIG. 2 is a schematic representation of a timing scheme with various exposure and purge phases. As shown, in the scheme 200, a first deposition cycle 210A may include a series of four operations (220A, 240A, 260A, 280A), which correspond with operations 104, 106, 108, and 110, respectively, in FIG. 1. Operation 104 corresponds with the TiI$_4$ exposure phase in 220A. Note during this exposure phase, argon is flowed as a carrier gas, TiI$_4$ is flowed into the chamber, and the plasma is turned off. Operation 106 corresponds with the purge phase 240A, where the TiI$_4$ exposure is turned off, the plasma is off, and only argon continues to flow. Operation 108 corresponds to plasma exposure phase 260A, where the plasma is turned on, the TiI$_4$ flow remains turned off, and argon continues to flow. The plasma helps remove any ligands, such as iodine atoms, attached to the deposited titanium to yield a highly pure titanium film. Operation 110 corresponds with purge phase 280A, where the plasma is turned off, the TiI$_4$ flow remains off, and argon continues to flow to purge any remaining TiI$_4$ or plasma. The deposition cycle 210B shows an example of a repeated deposition cycle used if an adequate thickness of the titanium film is not yet deposited on the substrate. In deposition cycle 210B, operations 104 through 110 in FIG. 1 are repeated, resulting in TiI$_4$ exposure phase 220B, purge phase 240B, plasma exposure phase 260B, and purge phase 280B, respectively. Further deposition cycles may be repeated as necessary.

The deposited highly pure titanium film may have a step coverage between about 70% and about 100%, or at least about 90% for features having an aspect ratio of about 3:1. In some embodiments where the aspect ratio is about 5:1, the step coverage of the titanium film may be between about 50% and about 70%. Deposition using the methods disclosed herein generally does not result in overhang of the film over the edges at the opening of the feature.

In various embodiments, the deposited titanium film may have less than about 0.1% atomic iodine impurities, or less than about 1% contamination. The titanium film may be deposited to any desired thickness, such as between about 2 nm and about 20 nm, or less than about 5 nm. The thickness of the film deposited per cycle may be about 0.5 Å. Cycles may be repeated as many times as is necessary for the desired titanium film. The deposited film may have a density of at least about 4.0 g/cc, or about 4.2 g/cc. In some embodiments, the titanium films deposited using the methods described herein have comparable characteristics and properties as titanium films deposited directly on substrates using PVD sputtering, except the film deposited using methods described herein have a higher step coverage than that of PVD sputtering in high aspect ratio features. In some embodiments, for a 140 Å titanium film, the resistance may be less than about 400 μΩ-cm.

Figure 3:
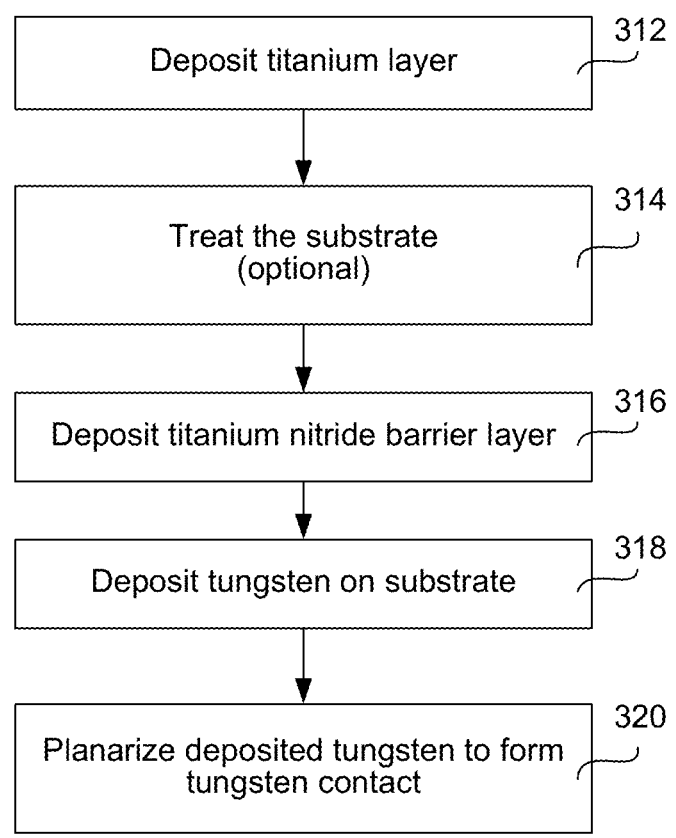
FIG. 3 is a process flow diagram illustrating operations in an example of an application of a method according to various embodiments.

FIG. 3 depicts a process flow diagram of an example of an application of the methods described herein. A titanium/titanium nitride film may be deposited using a variation of the methods described such that a thin, highly conformal film with high step coverage may be deposited in a high aspect ratio feature on a substrate. Titanium/titanium nitride films may be deposited in a feature as a barrier prior to depositing metal to form a contact.

A substrate having various high aspect ratio features may first be pre-cleaned using conditions and chemistries as described above with respect to operation 102 in FIG. 1. In some embodiments, the pre-clean operation may be optional. After the optional pre-clean, a thin titanium layer is deposited in operation 312 using methods and conditions such as those describe above with respect to operations 104-110 in FIG. 1. For example, highly pure, conformal titanium may be deposited to a thickness of less than about 2 nm having a density of at least 4.0 g/cc.

The deposited, highly pure titanium may be optionally post-treated in operation 314 using a thermal anneal at a temperature less than about 450° C., which results in the formation of titanium silicide (TiSi$_x$, where x=2 in some instances), or formation of TiSi$_x$Ge$_y$ (0<x+y<2).

After the optional post-treatment, titanium nitride may be deposited in operation 316 by ALD using a pulsing scheme. The chamber pressure, temperature, and carrier gas flow rates and types during this deposition may be the same as during the titanium deposition.

Titanium nitride may be deposited by first exposing the substrate to a precursor dose, where the plasma may be on or off, for a time between about 1 to 30 seconds. The precursor may be introduced to the substrate by a carrier or secondary gas flow. The precursor may be purged such that the precursor flow is stopped and the plasma is turned off, but the carrier or secondary gas flow continues to flow for about 1 to about 5 seconds. Subsequently, the substrate is exposed to a plasma dose where the carrier or secondary gas continues to flow, no additional precursor flow is introduced, and the plasma is turned on for a time between about 1 second and about 10 seconds. The plasma is then turned off, while the carrier or secondary gas continues to flow for about 1 to 5 seconds. These sequences may map to operations 104-110 in FIG. 1. Like FIG. 1, these operations may be repeated until the titanium nitride film is deposited to an adequate thickness.

Note that to deposit titanium nitride instead of pure titanium, the carrier or secondary gas includes a nitrogen-containing compound. In some embodiments, the nitrogen-containing compound is a metal-organic compound. Particularly reactive nitrogen-containing reactants may be used. In some embodiments where reactive nitrogen-containing reactants are used, the plasma dose may be reduced in time or power or may be eliminated. Examples of nitrogen-containing compounds that may be used include nitrogen (N$_2$), ammonia (NH$_3$), the hydrazine family, and amines. An example of metal organic precursors is tetrakisdiethylamidotitanium (TDEAT).

After the titanium nitride layer is deposited on the substrate, tungsten is deposited on the substrate to form a contact or tungsten plug in operation 318. In various embodiments, tungsten is deposited by CVD. The substrate may be optionally planarized in operation 320 to form the completed tungsten contact or tungsten plug.

The embodiments disclosed herein may be used to deposit highly conformal and substantially pure titanium, as well as titanium compounds such as titanium nitride, titanium silicide, and titanium oxide.

Apparatus

Figure 4:
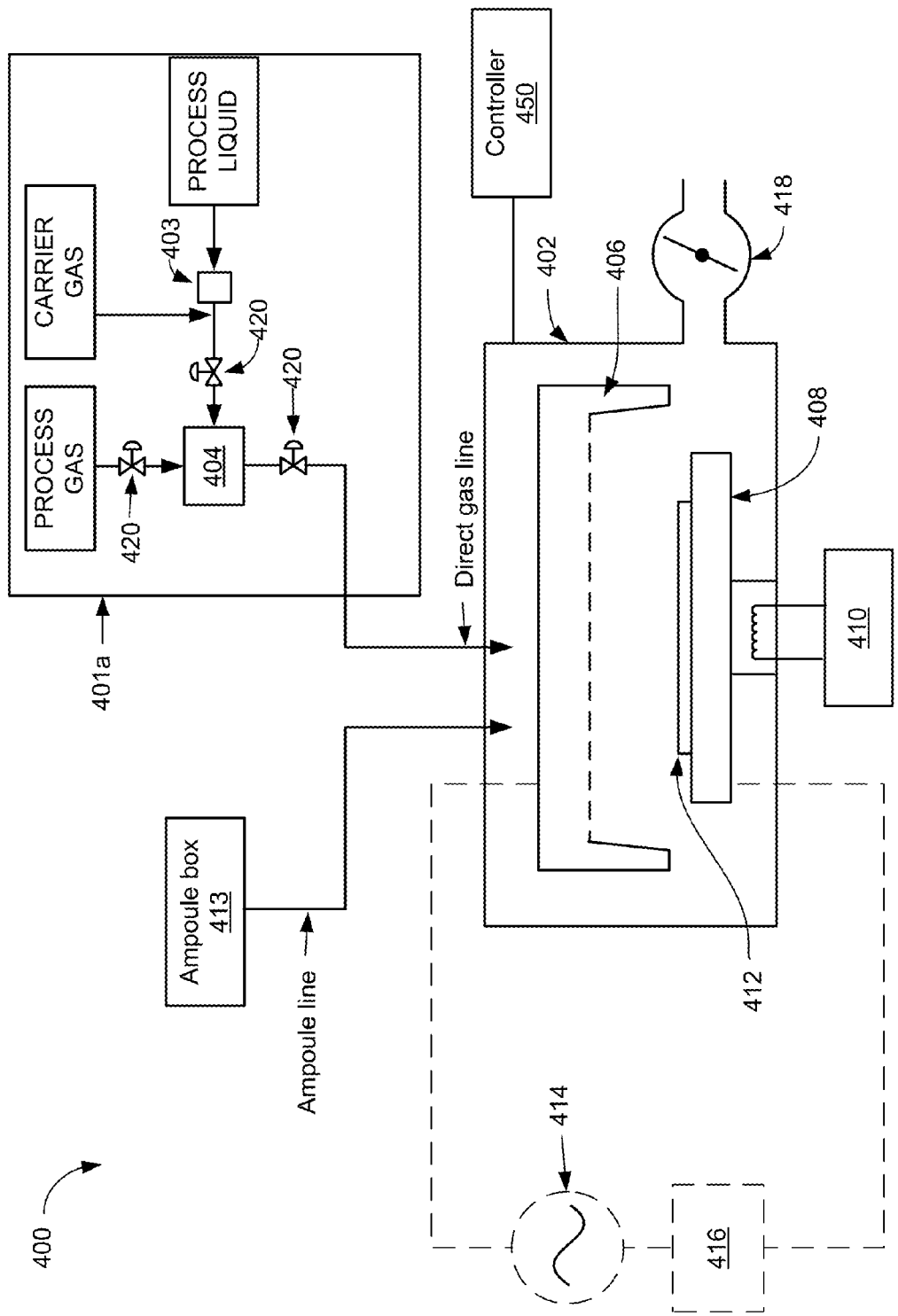
FIG. 4 is a schematic illustration of a processing chamber suitable for deposition processes in accordance with disclosed embodiments.
Figure 5:
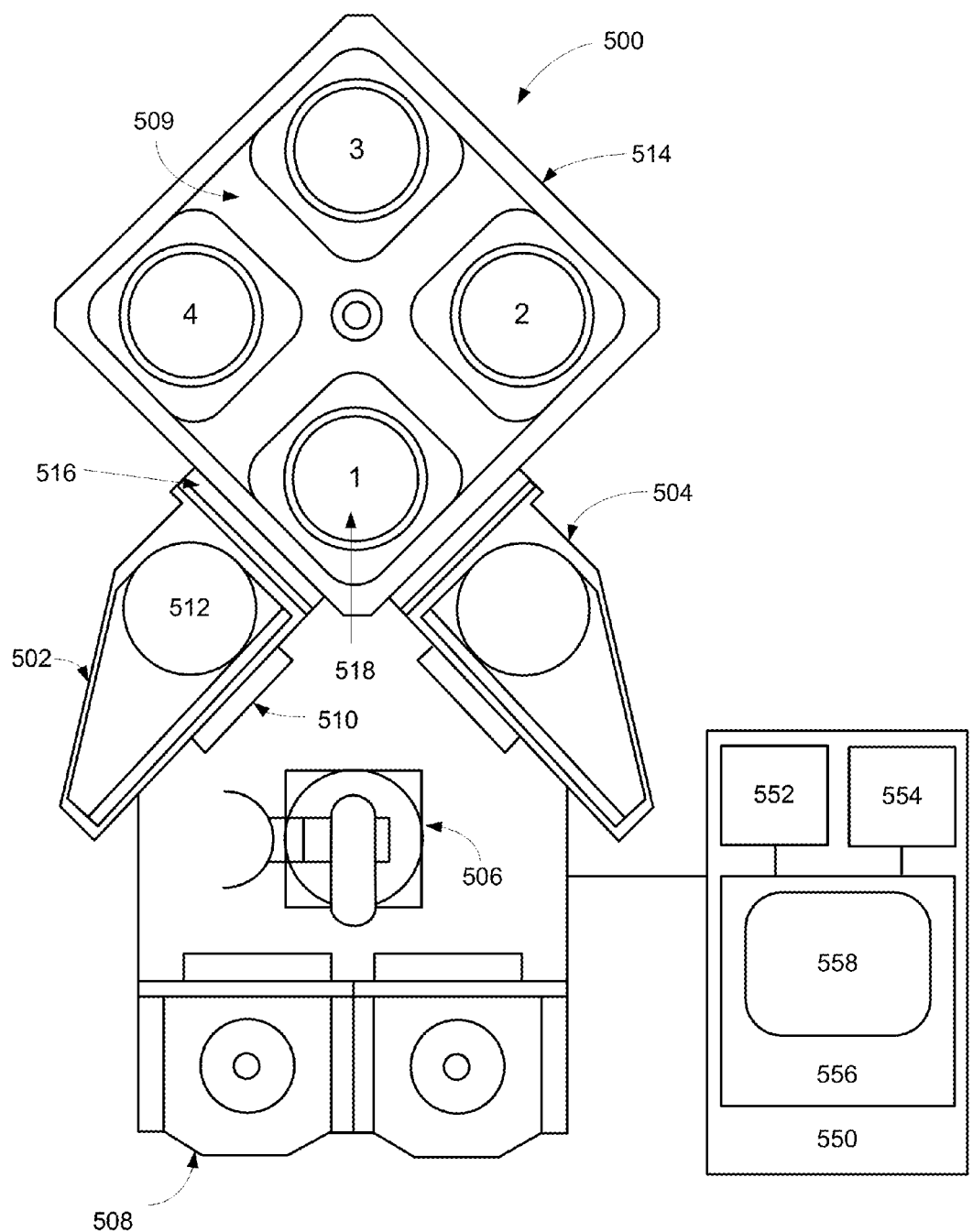
FIG. 5 is a schematic illustration of a processing system suitable for deposition processes in accordance with disclosed embodiments.

FIG. 4 depicts a schematic illustration of an embodiment of an atomic layer deposition (ALD) process station 400 having a process chamber body 402. A plurality of ALD process stations 400 may be included in a common process tool environment. For example, FIG. 5 depicts an embodiment of a multi-station processing tool 500. In some embodiments, one or more hardware parameters of ALD process station 400, including those discussed in detail below, may be adjusted programmatically by one or more computer controllers 450.

ALD process station 400 fluidly communicates with reactant delivery system 401*a* for delivering process gases to a distribution showerhead 406. Reactant delivery system 401*a* includes a mixing vessel 404 for blending and/or conditioning process gases for delivery to showerhead 406. One or more mixing vessel inlet valves 420 may control introduction of process gases to mixing vessel 404. The station 400 includes an ampoule box 413 which is connected to the chamber 402 via an ampoule line. For example, TiI$_4$ may be delivered using the reactant delivery system 401*a*.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

Optionally, pedestal 408 may be lowered and/or raised during portions the process to modulate process pressure, reactant concentration, etc. It will be appreciated that, in some embodiments, pedestal height may be adjusted programmatically by a suitable computer controller 450.

In another scenario, adjusting a height of pedestal 408 may allow a plasma density to be varied during plasma activation and/or treatment cycles included in the process. At the conclusion of the process phase, pedestal 408 may be lowered during another substrate transfer phase to allow removal of substrate 412 from pedestal 408.

Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as $TiI_4$), instructions for setting a flow rate of a carrier gas (such as argon or nitrogen), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as argon), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 408 may be temperature controlled via heater 410. For example, the pedestal 408 may be heated at low temperatures such as 300° C. using the heater 410 during deposition of highly conformal and pure titanium layers. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

As described above, one or more process stations may be included in a multi-station processing tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components necessary to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable media containing instructions for controlling process operations in accordance with the disclosed embodiments may be coupled to the system controller.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to evaluate characteristics of deposited titanium film used methods described herein. A titanium film was deposited by ALD on 5 kÅ of silicon oxide (e.g., TEOS) substrate using $TiI_4$ as a precursor and $Ar/H_2$ plasma. The film was deposited at a pedestal temperature of 300° C. and a pressure of 3 Torr.

FIG. 6A shows a transmission electron microscopy (TEM) image of the titanium film 602 as deposited. FIG. 6B shows a zoomed-in TEM image of the same film. The interface between the ALD Ti film and silicon oxide looks smooth. Film density was measured as 4.2 g/cc by XRR analysis, which is comparable with that of conventional PVD titanium film. The film resistivity was measured as about 300 µΩ-cm for a 140 Å thick film, which is only somewhat higher than a conventional PVD titanium film. The blanket film study shows that a suitable titanium film can be deposited using $TiI_4$ as a precursor at low temperatures.

Experiment 2

A titanium nitride film was deposited using methods described herein by ALD with $TiI_4$ as a precursor. The $TiI_4$ precursor was introduced to the chamber with $N_2$ as a reactant. The deposited TiN film had a resistivity of 200 µΩ-cm for a 60 Å film, which is comparable with that of PVD TiN. The film density as measured by XRR analysis was 4.6 g/cc, which is also comparable with that of PVD TiN films. The results suggest that resistivity of TiN films deposited in methods as described herein is lower than TiN films deposited using metal-organic precursors (TDMAT, TEMAT, etc.).

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing titanium on a semiconductor substrate in a chamber, the method comprising:
    (a) depositing titanium using atomic layer deposition cycles at a temperature less than about 450° C., each cycle comprising:
        (i) exposing the substrate to titanium tetraiodide,
        (ii) purging the chamber,
        (iii) exposing the substrate to an ignited plasma without a reactant, and
        (iv) purging the chamber; and
    (b) repeating (i) through (iv) until the desired thickness of titanium is deposited on the substrate.

2. The method of claim 1, further comprising prior to exposing the substrate to titanium tetraiodide, pre-cleaning the substrate.

3. The method of claim 1, wherein the substrate is exposed to a carrier gas throughout (i) through (iv).

4. The method of claim 3, wherein the carrier gas is selected from the group consisting of argon, hydrogen, and combinations thereof.

5. The method of claim 1, further comprising annealing the deposited titanium to form titanium silicide.

6. The method of claim 1, wherein the plasma is generated remotely.

7. The method of claim 1, wherein the plasma is generated in the chamber.

8. The method of claim 1, wherein the substrate is exposed to titanium tetraiodide in (i) for a duration between 1 and about 30 seconds, the substrate is purged in (ii) and (iv) each for a duration between 1 and 5 seconds, and the substrate is exposed to a plasma in (iii) for a duration between 1 and 10 seconds.

9. The method of claim 1, wherein the deposited titanium has less than about 1% contamination.

10. The method of claim 1, wherein the deposited titanium has a film density of at least about 4.0 g/cc.

11. The method of claim 1, wherein each cycle deposits titanium having a thickness of about 0.5 Å.

12. The method of claim 1, wherein the deposited titanium has a step coverage of between about 70% and about 100%.

13. The method of claim 1, wherein the chamber has a chamber pressure between about 0.1 Torr and about 20 Torr.

14. The method of claim 1, wherein the substrate comprises features having aspect ratios between about 3:1 and about 10:1.

15. The method of claim 1, further comprising:
    (d) depositing titanium nitride using atomic layer deposition cycles at a temperature less than about 450° C., each cycle comprising:
        (i) exposing the substrate to titanium tetraiodide,
        (ii) purging the chamber,
        (iii) exposing the substrate to a nitrogen-containing gas and igniting a plasma, and
        (iv) purging the chamber; and
    (e) repeating (i) through (iv) of (d) until the desired thickness of titanium nitride is deposited on the substrate.

16. The method of claim 15, wherein the nitrogen-containing gas is selected from the group consisting of nitrogen, ammonia, hydrazines, and amines.

17. An apparatus for depositing titanium on a semiconductor substrate, the apparatus comprising:
    a reaction chamber comprising a pedestal for holding the substrate;
    at least one outlet for coupling to a vacuum;
    one or more process gas inlets coupled to one or more precursor sources;
    a remote radio frequency (RF) plasma generator; and
    a controller for controlling operations in the apparatus, comprising machine-readable instructions for:
        (a) setting the temperature of the pedestal in the reaction chamber to a temperature less than about 450° C.,
        (b) introducing titanium tetraiodide to the reaction chamber,
        (c) purging the reaction chamber,
        (d) providing a plasma to the reaction chamber from the remote plasma generator,
        (e) purging the reaction chamber, and
        (f) repeating (b) through (e).

18. The apparatus of claim 17, wherein the instructions are configured to deposit about 0.5 Å of titanium in each cycle of (b) through (e).

19. The apparatus of claim 17, wherein the controller further comprises machine-readable instructions for:
    (g) introducing titanium tetraiodide to the reaction chamber,
    (h) purging the reaction chamber,
    (i) providing a second plasma in the reaction chamber,
    (j) introducing a nitrogen-containing gas to the reaction chamber,
    (k) purging the reaction chamber, and
    (l) repeating (g) through (k).

20. The apparatus of claim 19, wherein the nitrogen-containing gas is selected from the group consisting of nitrogen, ammonia, hydrazines, and amines.

21. The apparatus of claim 17, wherein the machine-readable instructions for providing the plasma to the reaction chamber from the remote plasma generator further comprises machine-readable instructions for providing the plasma without a reactant.

22. A method of depositing titanium on a semiconductor substrate in a chamber, the method comprising:
    (a) depositing titanium using atomic layer deposition cycles at a temperature less than about 450° C., each cycle comprising:
        (i) exposing the substrate to titanium tetraiodide,
        (ii) purging the chamber,
        (iii) exposing the substrate to an ignited plasma, and
        (iv) purging the chamber; and
    (b) repeating (i) through (iv) until the desired thickness of titanium is deposited on the substrate,
    wherein the plasma is ignited in a remote plasma generator.

23. The method of claim 22, wherein the deposited titanium has a step coverage of between about 70% and about 100%.

24. The method of claim 1, wherein the temperature is 300° C.

25. The method of claim 22, wherein the temperature is 300° C.

* * * * *